(12) United States Patent
Heuser et al.

(10) Patent No.: US 8,131,489 B2
(45) Date of Patent: Mar. 6, 2012

(54) LONG DATA RECORD ANALYSIS

(75) Inventors: Patricia A. Heuser, Portland, OR (US);
Tristan A. Robinson, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 1412 days.

(21) Appl. No.: 11/588,809

(22) Filed: Oct. 27, 2006

(65) Prior Publication Data
US 2008/0147342 A1   Jun. 19, 2008

(51) Int. Cl.
*G06F 19/00* (2011.01)
(52) U.S. Cl. ............... 702/67; 702/71; 702/189
(58) Field of Classification Search .............. 386/13, 386/21; 702/67, 71, 79, 176, 179, 187, 189; 714/100
See application file for complete search history.

(56) References Cited

U.S. PATENT DOCUMENTS

| | | | |
|---|---|---|---|
| 4,682,292 A * | 7/1987 | Bue et al. | 701/35 |
| 6,807,496 B2 * | 10/2004 | Pickerd | 702/67 |
| 6,980,212 B2 * | 12/2005 | Letts | 345/440.1 |
| 7,755,664 B2 * | 7/2010 | Kakinuma et al. | 348/208.1 |
| 2003/0058243 A1 * | 3/2003 | Faust et al. | 345/440 |

* cited by examiner

OTHER PUBLICATIONS

OrCAD Layout, User's Guide, 1998, pp. 1-209.*

*Primary Examiner* — Michael Nghiem
*Assistant Examiner* — Elias Desta
(74) *Attorney, Agent, or Firm* — Francis I. Gray; Thomas F. Lenihan

(57) ABSTRACT

A data analysis technique for a long data record in a memory uses a reference, either user-provided or calculated from the data in the long data record, as a representative event. Each event in the long data record is compared with the reference to determine whether there are significant deviations from the reference. Those events having significant deviations are identified as events of particular interest for a user. The reference may be either a waveform shape or a mean time interval between events. A tolerance value may be added to the waveform reference and varied for dynamic limit testing. Events that are outside the waveform reference as modified by the tolerance value are identified as outliers and may be reduced to iconic images for display simultaneously with the long data record and a selected one of the outliers.

17 Claims, 3 Drawing Sheets

LONG DATA RECORD ANALYSIS

BACKGROUND OF THE INVENTION

The present invention relates to the analysis of a long data record in a memory, and more particularly to a data analysis where the long data record contains repetitive data over a period of time.

Digital oscilloscopes acquire data in response to a trigger event. The amount of data acquired for each trigger event may be specified by a user. For sporadic events or other pulse events the data of interest is centered on a pulse characteristic, such as pulse width, rise time, fall time, etc. Digital oscilloscopes have acquisition memories capable of storing millions of data points. To make optimum use of the acquisition memory, it is generally desirable to acquire only the data associated with the particular trigger event. Therefore each data acquisition may only acquire a limited number of points of data. Each data acquisition may be considered to be a segment or frame, with each frame generally being of equal length. However this still means that there are potentially tens of thousands of frames stored as a long data record in the acquisition memory. The problem exists in analyzing all of these frames in a timely and useful manner. The analysis may be related to a pulse shape or a pulse interval. For example on a display one frame is displayed at a time, as shown in FIG. 1. The user may scroll through the acquisition memory one frame at a time and visually compare the current record with a reference waveform, shown in a contrasting shade or hue together with the presently displayed frame. A delta time may also be calculated between the reference or first frame in the acquisition memory and each subsequent frame as a timestamp for interval timing analysis. Further the user may set up a summary frame that is the average of all frames or an envelope view of all frames as the reference frame. The user may also display a timestamp table, also shown in FIG. 1, that requires scanning multi-digit numbers, such as 18 digits, to locate records that deviate significantly from one another, indicating problem areas. As with scrolling through the frames, the scanning of large columns of numbers is very time consuming. Scrolling and scanning are only used to locate potential problem areas. Additional effort is required from the user for any statistical analysis, for example by exporting the timestamp data to an external program, such as the Microsoft® Excel program, to create a graphic display.

The problem is multiplied when the memory is not segmented and the entire long data record is being analyzed. The user has to scroll through the long data record looking for problem signatures, either in the waveform shape or in the repetitive nature of the data.

What is desired is a data analysis technique that provides easy analysis of long data records within the acquisition memory of a digital oscilloscope to assist the user in determining trends and problem areas in an expeditious manner.

BRIEF SUMMARY OF THE INVENTION

Accordingly the present invention provides a data analysis technique for a long data record in a memory that uses a reference, either user-provided or calculated from the data in the long data record, as a representative segment or frame for the long data record. The long data record is compared with the reference to determine whether there are significant deviations from the reference. Those portions of the long data record having significant deviations are identified as areas of particular interest for a user. The reference may be either a waveform shape or a mean time interval between identified events.

For comparing waveform shapes a tolerance value is added to the reference. The tolerance value may be varied or adjusted for dynamic limit testing. Portions of the long data record that are outside the reference as modified by the tolerance value are identified as outliers. The outliers may be reduced to iconic images. The long data record, one of the outliers and the iconic images may be displayed simultaneously, with a cursor being used to identify where within the long data record the displayed outlier is located. Also all outliers within the long data record may be highlighted as well.

For comparing time intervals between significant events the deviation from the mean time interval is determined for each event, and the resulting deviations from the mean time interval for each event are displayed for the long data record simultaneously with a selected portion from the long data record. A coupled cursor may be used to indicate a particular portion within the selected portion and its corresponding location within the long data record. Further highlighting may be used to indicate within the long data record where the areas having significant deviations are located, with the type of highlighting indicating an approximate magnitude of the deviation.

The objects, advantages and other novel features of the present invention are apparent from the following detailed description when read in conjunction with the appended claims and attached drawing.

DETAILED DESCRIPTION OF THE INVENTION

The following description for ease of understanding is based upon a segmented memory where a long data record is segmented into a plurality of acquisitions, each acquisition forming a data frame. The significant events are the trigger events that generated the data acquisition for each data frame.

Figure 1:
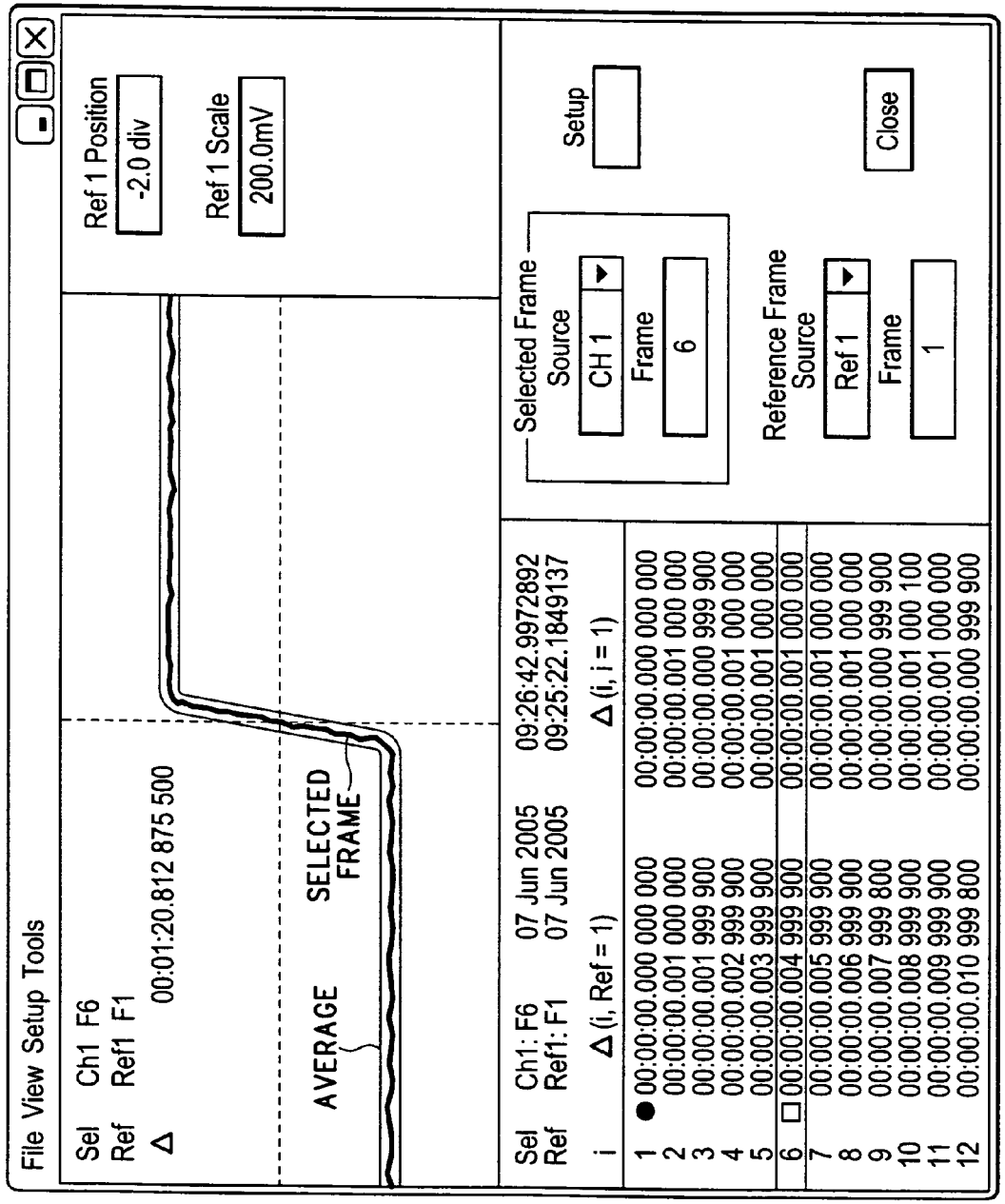
FIG. 1 is a plan view of a data display showing a portion of a long data record as a waveform shape and showing a timestamp table for a plurality of events within the long data record according to the prior art.
Figure 2:
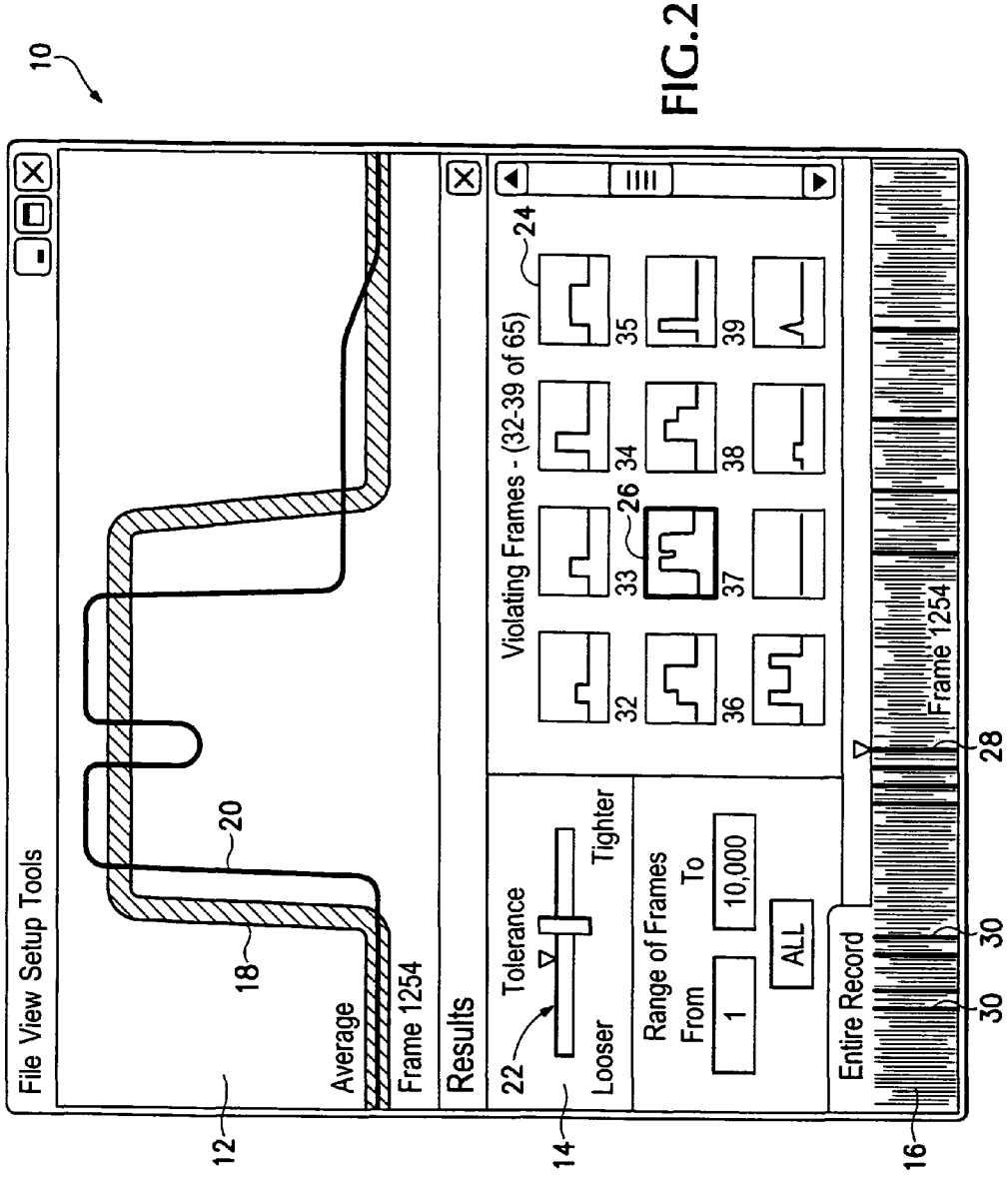
FIG. 2 is a plan view of a data display for analyzing data based on waveform shapes according to the present invention.

Referring now to FIG. 2 a display 10 is shown having a graticule area 12 for displaying waveform shapes and a user interface (UI) area 14 for displaying control functions as well as preliminary analysis results. Also a "bird's-eye" view 16 of the frames in an acquisition memory is displayed. Once the acquisition memory is filled to produce the long data record, each frame is analyzed to determine certain characteristics about waveform shapes, such as pulse width, rise time, fall time, etc. From the characteristics for all the waveform shapes an average wave shape 18 as shown, or alternatively an envelope view, may be calculated and displayed in the graticule area 12 as a reference frame. The reference frame may be provided by a user rather than calculated from the data within the acquisition memory. A default tolerance is set about the waveform shape 18 for the reference frame, and the waveform shape for each frame 20 in the acquisition memory is compared with the reference waveform shape to determine whether the data matches the reference waveform shape within the tolerance limits. Each frame that has data that falls outside the tolerance limits, i.e., an "outlier" frame, is identified and the frame number within the acquisition memory is stored.

If there are multiple (such as hundreds) outliers and, when randomly examined by the user in the graphic area 12, most are considered by the user to be within specifications, the tolerance limits may be adjusted by a tolerance control 22 in the UI area 14 to narrow the number of outliers to a more reasonable number for detailed analysis. In this way the user is directed to those frames having the most likelihood of exhibiting abnormal behavior. Also observing the effect of varying the tolerance on the number of outliers provides a dynamic limit test for the data in the acquisition memory. Increasing the tolerance reduces the number of frames that fall outside the limit, and decreasing the tolerance increases the number of frames that fall outside the limit. Users may quickly see how much difference that makes in the number of outliers. If most frames vary only slightly from the average, then small changes in the tolerance do not significantly change the number of outliers. This provides the users with a simplified display for locating potential problem pulses, and with the flexibility to quickly see if the long data record contains wide deviations or very little divergence from the average.

Figure 3:
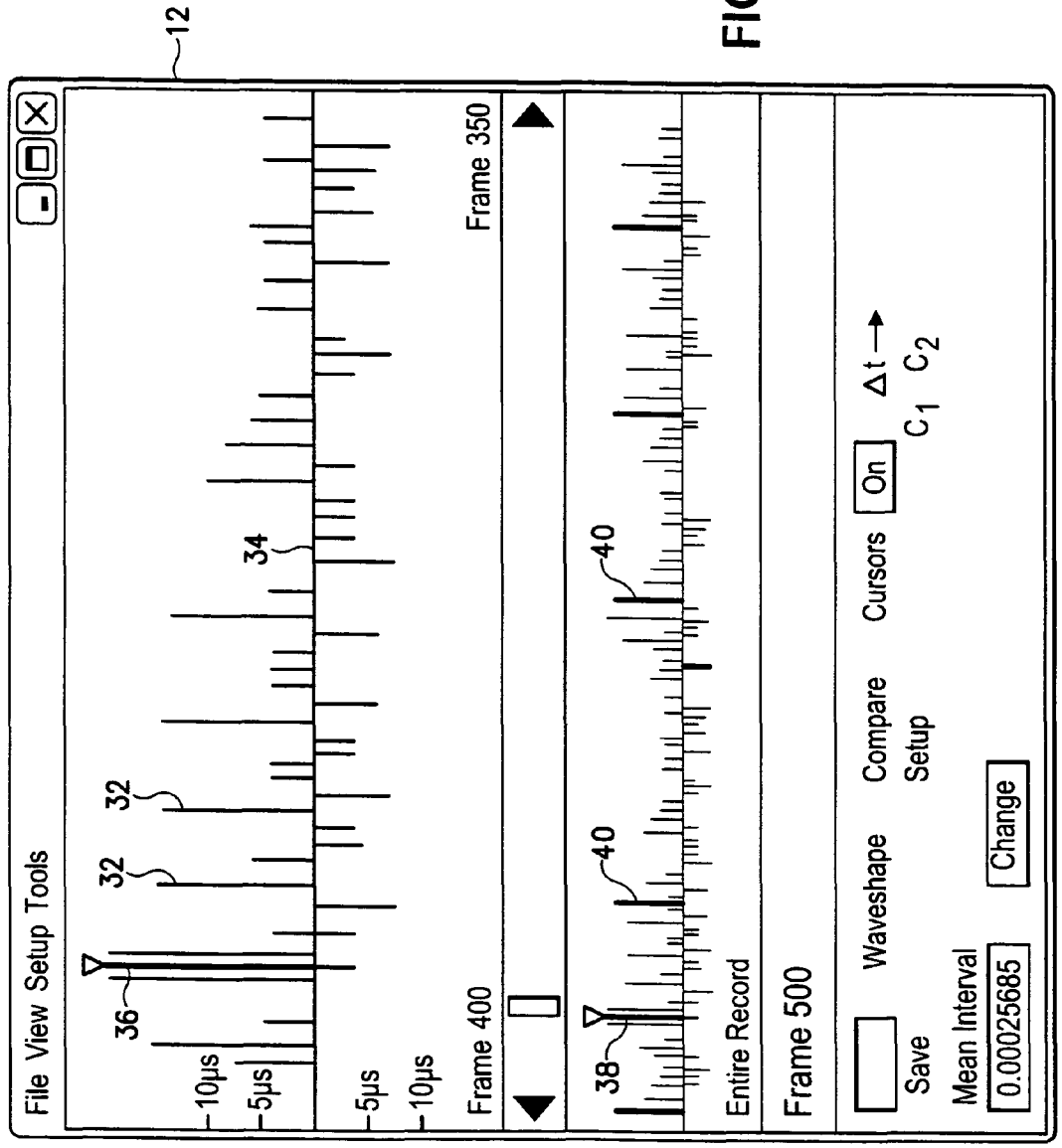
FIG. 3 is a plan view of a data display for analyzing a data based on time intervals between events according to the present invention.

Once the number of outliers has been reduced to a reasonable number, each outlier frame may be encapsulated as a "postage stamp" or icon 24 and displayed in the UI area 14. From the postage stamps 24 a user may select a particular frame 26 for display for direct comparison as an outlier waveform shape 20 in the graticule area 12 with the reference waveform shape 18. The postage stamp 24 for the particular frame selected may be highlighted, and a marker 28 may be shown in the bird's-eye view 16 to visually indicate the location of the selected frame within the acquisition memory. By varying the tolerance limits slightly, the user may readily see the effect on the number of outliers. Also by displaying the outlier frame numbers the user may ascertain a pattern for the outliers, either as being grouped together, occurring at regular intervals or being unrelated. The location and amount of deviation from the reference value of the outliers in the bird's-eye view 16 may be indicated by variations 30 in color or shading.

Where interval timing between events or pulses is important, the timestamps for each frame may be used. A mean value for the intervals from frame to frame is determined, and any deviation from the mean value for each interval is determined. As shown in FIG. 3 the deviations 32 from the mean time interval 34 for each frame may be graphically displayed in the graticule area 12 to identify any trends in the deviations. Random deviations may be attributed to signal noise, but any type of coherent variation may be readily ascertained by the user. Again any particular frame may be examined and a cursor 36 may be used to examine in more detail any particular one of the frames, with a corresponding cursor 38 in the bird's eye view indicating the location of the particular frame in the acquisition memory. Also for statistical purposes the hue or shading of the frames 40 in the bird's eye view may be varied to indicate the amount of deviation from the mean— such as for one, two, three, etc. standard deviations. Significant patterns in time are, thus, readily identifiable visually, saving the user from having to scan through the entire long data record to find frames of interest.

The above discussion has been with respect to a segmented memory analysis. However analysis of the entire long data record may be achieved where the data represents a single data acquisition of a signal having repetitive features. For example a continuous wave (CW) signal has zero crossing points at regular intervals, so the cycles of the CW signal may be used to develop the average or envelope wave shape for use as the reference. The start of each cycle may be considered to be a significant event for timing interval determinations, and each cycle may be a data frame. Then the analysis is performed as indicated above. Likewise for any signal representing digital data, each pulse may be identified and a representative pulse shape determined from the entire long data record as well as a mean interval between pulses. Further for the digital data the analog data may be converted into binary information, and the binary patterns (such as headers, enders or other significant data packets) may be used as the significant events to identify the data frames. Data packets that are non-conforming with a reference data packet may be highlighted and saved as an icon, displayed as a waveform, etc.

Thus the present invention provides data analysis for a long data record by comparing each frame of acquired data, as defined by a significant event, within the long data record with a reference based upon waveform characteristics or interval timing, identifying frames that deviate significantly from the reference, and providing a display of outliers or interval timing trends that enables the user to readily locate frames of interest, either in the analog or digital domain.

What is claimed is:

1. A method of data analysis in a test and measurement instrument comprises:
   inputting a long data record into a memory of the test and measurement instrument which contains repetitive data over a period of time, each instance of the repetitive data forming a data frame, wherein the method further comprising the steps of:
   specifying, by the measurement instrument a reference frame having a tolerance value for the long data record;
   comparing, by the measurement instrument each data frame with the reference frame to identify outlier frames that have significant deviations from the reference frame as determined by the tolerance value; and
   displaying a selected one of the outlier frames in a graticule view on the test and measurement instrument display.

2. The method as recited in claim 1 further comprising the step of displaying a "bird's eye" view of the long data record together with the graticule view.

3. The method as recited in claim 1 wherein the displaying step comprises the step of displaying a plurality of postage stamps in a user interface view, one for each of the outlier frames.

4. The method as recited in claim 1 wherein the specifying step comprises the step of storing a user-provided reference frame as the reference frame.

5. The method as recited in claim 4 wherein the user-provided reference frame comprises a reference frame selected from a group consisting of a waveform shape, a mean interval between data frames and a defined data packet.

6. The method as recited in claim 1 wherein the specifying step comprises a step of calculating the reference frame as an average of the data frames within the long data record.

7. The method as recited in claim 6 wherein the reference frame comprises an average waveform shape.

8. The method as recited in claim 7 wherein the average waveform shape comprises an average of all of the data frames excluding the outlier frames.

9. The method as recited in claim 7 further comprising the step of varying the tolerance value for the reference frame to vary the number of outlier frames.

10. The method as recited in claim 2 further comprising the step of providing a cursor in the "bird's eye" view to indicate a location within the long data length record of the outlier frame being displayed in the graticule view.

11. The method as recited in claim 10 further comprising the step of highlighting in the "bird's eye" view the outlier frames.

12. The method as recited in claim 7 further comprising the steps of:

generating icons for the outlier frames, each icon representing a waveform shape for its associated outlier frame; and displaying the icons in a user interface view.

13. The method as recited in claim 12 further comprising the step of selecting one of the icons from the user interface view for displaying the associated outlier frame in the graticule view.

14. The method as recited in claim 13 further comprising the step of highlighting the icon for the outlier frame represented in the graticule view.

15. The method as recited in claim 4 wherein the user-provided reference frame comprises a mean interval between data frames as the reference frame.

16. The method as recited in claim 1 wherein the specifying step comprises a step of calculating from the data frames within the long data record a mean time interval between the data frames as the reference frame.

17. The method as recited in claim 2 wherein the displaying step comprises the step of displaying a plurality of postage stamps in a user interface view, one postage stamp for each of the outlier frames.

* * * * *